US008536609B2

(12) United States Patent
Chung et al.

(10) Patent No.: US 8,536,609 B2
(45) Date of Patent: Sep. 17, 2013

(54) ORGANIC LIGHT EMITTING DIODE DISPLAY

(75) Inventors: Yun-Mo Chung, Yongin (KR); Jeong-Yeong Jeong, Yongin (KR); Jong-Ryuk Park, Yongin (KR); Jin-Wook Seo, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 13/552,100

(22) Filed: Jul. 18, 2012

(65) Prior Publication Data

US 2013/0200422 A1 Aug. 8, 2013

(30) Foreign Application Priority Data

Feb. 8, 2012 (KR) .......................... 10-2012-0012920

(51) Int. Cl.
*H01L 33/00* (2010.01)
(52) U.S. Cl.
USPC .......................................... 257/98; 313/506
(58) Field of Classification Search
USPC .......................................... 257/98; 313/506
See application file for complete search history.

(56) References Cited

U.S. PATENT DOCUMENTS 8,324,805 B2 * 12/2012 Hayashi ...................... 313/504
2012/0228597 A1 * 9/2012 Robinson et al. ............ 257/40
2012/0286248 A1 * 11/2012 Lee et al. ..................... 257/40

FOREIGN PATENT DOCUMENTS

| KR | 10-2009-0008627 | | 1/2009 |
| KR | 10-2009-0047885 | A | 5/2009 |
| KR | 10-2009-0059871 | A | 6/2009 |
| KR | 10-2009-0122680 | A | 12/2009 |
| KR | 10-2011-0084110 | A | 7/2011 |
| KR | 10-2011-0095751 | | 8/2011 |

* cited by examiner

*Primary Examiner* — David Vu
*Assistant Examiner* — Brandon Fox
(74) *Attorney, Agent, or Firm* — Lee & Morse, P.C.

(57) ABSTRACT

An organic light emitting diode display includes a substrate, an organic light emitting diode provided on the substrate and including a first electrode, an organic emission layer, and a second electrode, a packed layer on the organic light emitting diode, and a protective layer on the packed layer, the protective layer including at least one of a graphene oxide and a graphene nitride.

11 Claims, 8 Drawing Sheets

ORGANIC LIGHT EMITTING DIODE DISPLAY

RELATED APPLICATIONS

This application claims priority to and the benefit of Korean Patent Application No. 10-2012-0012920 filed in the Korean Intellectual Property Office on Feb. 8, 2012, the entire contents of which are incorporated herein by reference.

BACKGROUND

1. Field

The described technology relates generally to an organic light emitting diode (OLED) display.

2. Description of the Related Art

An organic light emitting diode (OLED) display is a self-emissive display device that displays images with organic light emitting diodes. The organic light emitting diode display differs from a liquid crystal display in that it does not require a separate light source, and has relatively small thickness and weight. Furthermore, as the organic light emitting diode display involves high quality characteristics such as low power consumption, high luminance, and a short response time, it is spotlighted as a next generation display device for portable electronic appliances.

The above information disclosed in this Background section is only for enhancement of understanding of the background of the described technology and therefore it may contain information that does not form the prior art that is already known in this country to a person of ordinary skill in the art.

SUMMARY

An exemplary embodiment provides an organic light emitting diode display, including a substrate, an organic light emitting diode provided on the substrate and including a first electrode, an organic emission layer, and a second electrode, a packed layer on the organic light emitting diode, and a protective layer on the packed layer, the protective layer including at least one of a graphene oxide and a graphene nitride.

The packed layer may include at least one selected from the group of an organic material and an inorganic material.

The packed layer may include the organic material, and the organic material may include a polyimide.

The packed layer may include the inorganic material, and the organic material may include at least one selected from the group of silicon oxide and silicon nitride.

The packed layer may be a stack of multiple layers.

The substrate may be made of glass or a flexible polymer.

The substrate may include an upper substrate and a lower substrate, the upper substrate being made of a flexible polymer, and the lower substrate being made of a graphene compound.

The flexible polymer may include at least one selected from the group of a polyimide, polyethersulfone, and polyethylene naphthalate, and the graphene compound may include at least one selected from the group of a graphene oxide and a graphene nitride.

The display may include, in sequence: the substrate, the organic light emitting diode, the packed layer, the packed layer planarizing the underlying organic light emitting diode, and the protective layer, the protective layer having a substantially uniform thickness.

The substrate may include, in sequence: a lower substrate, and an upper substrate, the upper substrate contacting the lower substrate, the upper substrate being between the lower substrate and the organic light emitting diode.

The packed layer may include a stack of multiple layers between the organic light emitting diode and the protective layer, the multiple layers including alternating organic and inorganic layers respectively formed from polyimide and at least one selected from the group of silicon oxide and silicon nitride.

BRIEF DESCRIPTION OF THE DRAWINGS

Features will become apparent to those of skill in the art by describing in detail exemplary embodiments with reference to the attached drawings in which.

DETAILED DESCRIPTION

Exemplary embodiments of the present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it may be directly on the other element or intervening elements may also be present. In contrast, when an element is referred to as being "directly on" another element, there are no intervening elements present.

An organic light emitting diode (OLED) display according to an exemplary embodiment will now be described in detail with reference to accompanying drawings.

Figure 1:
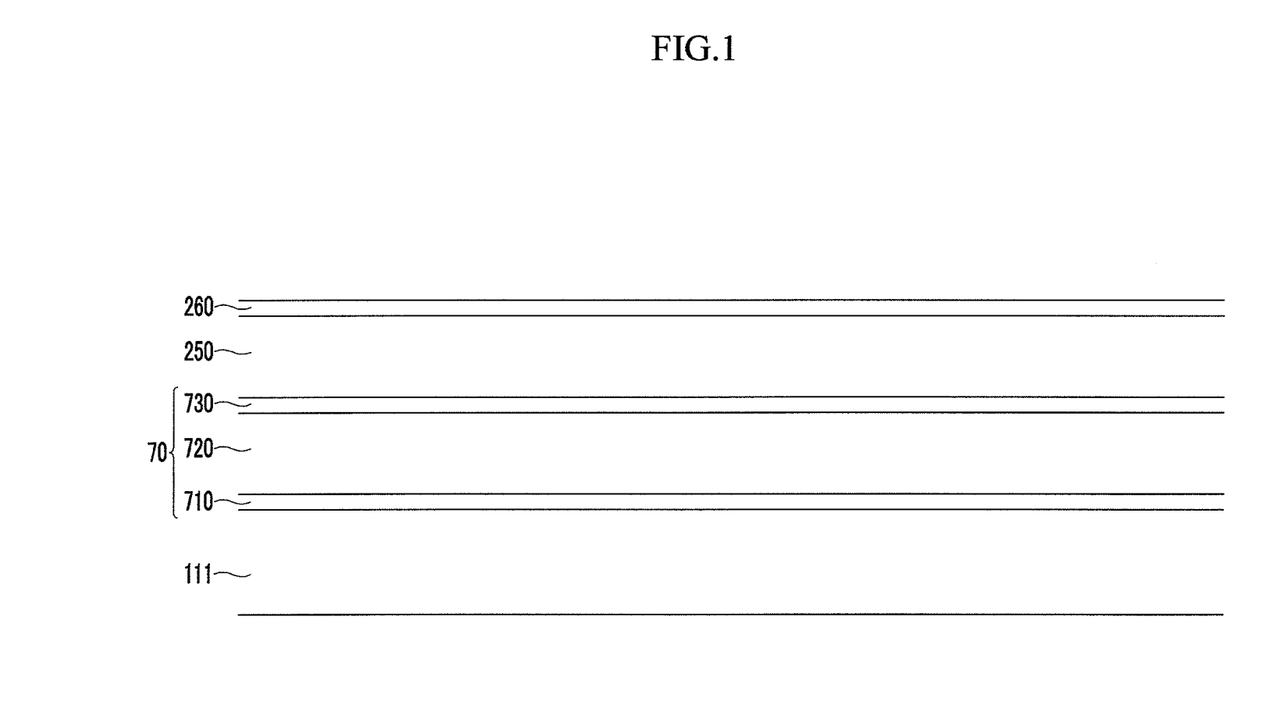
FIG. 1 shows a cross-sectional view of an organic light emitting diode (OLED) display according to an exemplary embodiment.

FIG. 1 shows a cross-sectional view of an organic light emitting diode (OLED) display according to an exemplary embodiment.

In the exemplary embodiment shown in FIG. 1, the organic light emitting diode display includes a substrate 111, an organic light emitting diode 70 formed on the substrate 111, a packed layer 250 formed on the organic light emitting diode 70, and a protective layer 260 formed on the packed layer 250.

In the present example embodiment, the substrate 111 may be, e.g., a glass substrate, or a flexible substrate made of a polymer material such as a polyimide, polyethersulfone, or polyethylene naphthalate.

In the present exemplary embodiment, the organic light emitting diode 70 includes a first electrode 710, an organic emission layer 720, and a second electrode 730.

In the present example embodiment, the packed layer 250 covers the organic light emitting diode 70. The packed layer 250 may provide a flat surface to the substrate. The packed layer 250 may be formed to be a single layer or multiple layers. The layers may be made of an organic material such as a polyimide or an inorganic material such as silicon oxide or silicon nitride.

In the present exemplary embodiment, the protective layer 260 includes at least one of a graphene oxide and a graphene nitride. The graphene oxide and the graphene nitride may have an electrical insulating characteristic.

Figure 8:
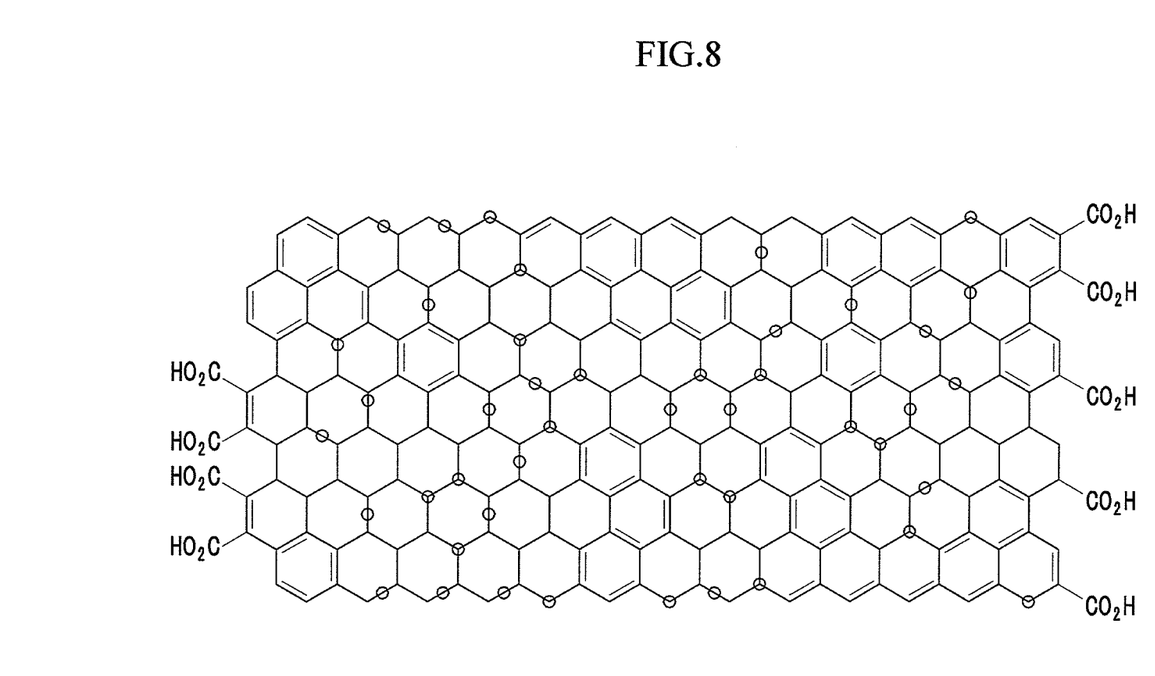
FIG. 8 shows a configuration of a graphene oxide according to an exemplary embodiment.

As shown in FIG. 8, graphene oxide may have a structure in which oxygen is combined to the surface of the graphene, and may have an insulating characteristic in a vertical direction. The graphene oxide may be formed by a chemical delamination method for oxidizing graphite with nitric acid ($HNO_3$), sulfuric acid ($H_2SO_4$), chromic acid ($H_2CrO_4$), or potassium chlorate ($KClO_3$).

The graphene compound may include a graphene layer with a single layer or multiple layers depending on how the graphene is formed.

When the protective layer is formed with the graphene compound, an expensive glass substrate may be omitted so production cost of the organic light emitting diode display may be reduced.

The graphene compound may have a very high hydrophobic characteristic. Without being bound by theory, the absorption energy with $H_2O$ and the graphene compound may be very much less than the internal combination energy of molecules of water drops. Therefore, the organic light emitting element may be protected from external moisture to prevent corrosion and oxidation. Further, the graphene compound may provide excellent strength and elasticity so it may be used to form the flexible organic light emitting diode display. Also, a bonding force with an inorganic material or an organic material forming the packed layer may be excellent to improve durability of the organic light emitting diode display.

An organic light emitting diode display including the above-described graphene compound will now be described with reference to FIG. 2 to FIG. 7.

Figure 2:
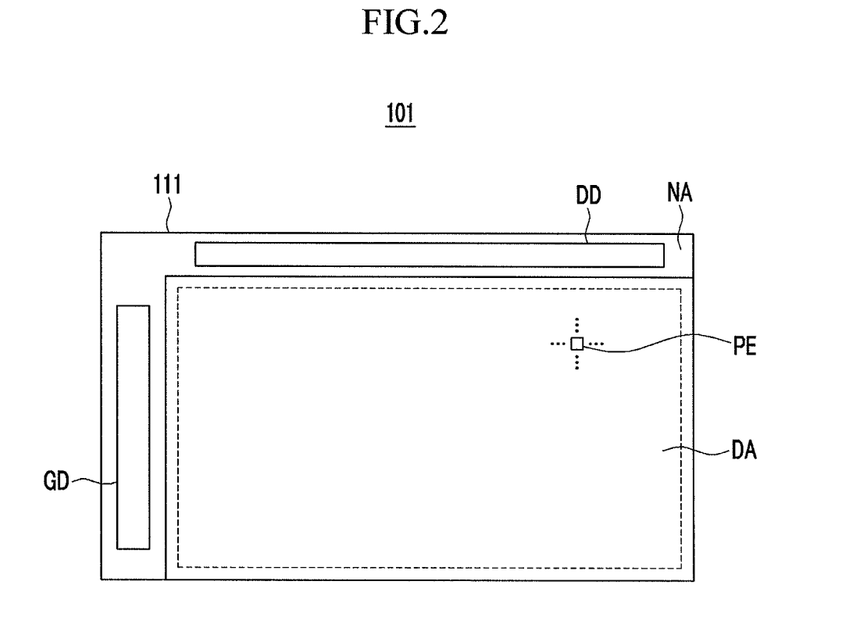
FIG. 2 shows a top plan view of a configuration of an organic light emitting diode (OLED) display according to an exemplary embodiment.
Figure 3:
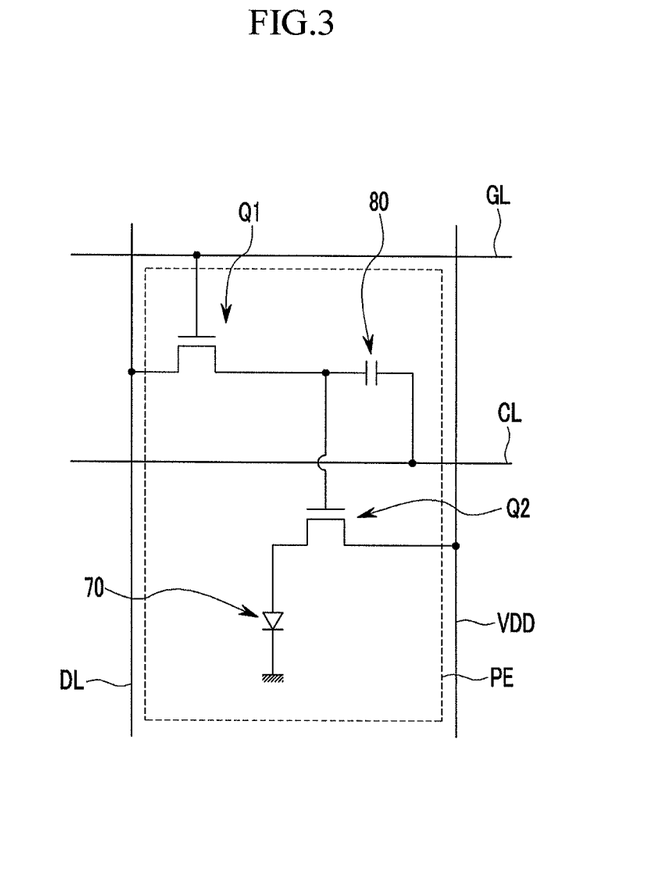
FIG. 3 shows a circuit diagram of a pixel circuit of an organic light emitting diode (OLED) display shown in FIG. 2.

FIG. 2 shows a top plan view of a configuration of an organic light emitting diode (OLED) display 101 according to an exemplary embodiment. FIG. 3 shows a circuit diagram of a pixel circuit of an organic light emitting diode (OLED) display shown in FIG. 2.

In the exemplary embodiment shown in FIG. 2, the organic light emitting diode display includes a substrate 111 divided as a display area (DA) and a non-display area (NA). A plurality of pixels (PE) is formed in the display area (DA) of the substrate 111 to display an image, and at least one driving circuit (GD, DD) is formed in the non-display area (NA) thereof.

In the present example embodiment, as shown in FIG. 3, a pixel (PE) has a 2Tr-1 Cap structure including an organic light emitting diode 70, two thin film transistors (TFTs) 10 and 20, and a capacitor 80. However, the exemplary embodiment is not limited thereto. For example, the one pixel (PE) may have at least three thin film transistors and at least two capacitors, and it may be formed in various structures with additional wiring. Thin film transistors and the capacitors that are added may configure a compensation circuit. The compensation circuit may improve uniformity of the organic light emitting diode 70 formed per pixel (PE) to reduce deviation of image quality. In general, the compensation circuit may include two to eight thin film transistors.

Also, the driving circuit (GD, DD) formed in the non-display area (NA) of the substrate 111 may include one or more additional thin film transistors.

In the present example embodiment, the organic light emitting diode 70 includes an anode representing a hole injection electrode, a cathode representing an electron injection electrode, and an organic emission layer disposed between the anode and the cathode.

In the present example embodiment, the pixel (PE) includes a first thin film transistor 10 and a second thin film transistor 20. The first thin film transistor 10 and the second thin film transistor 20 include a gate, a semiconductor layer, a source, and a drain, respectively. The semiconductor layer of at least one of the first thin film transistor 10 and the second thin film transistor 20 includes an impurity-doped polysilicon film. That is, at least one of the first thin film transistor 10 and the second thin film transistor 20 is a polysilicon thin film transistor.

FIG. 3 shows a gate line (GL), a data line (DL), a common power line (VDD), and a capacitor line (CL), and the capacitor line (CL) may be omitted if necessary.

In the present example embodiment, the source of the first thin film transistor 10 is connected to the data line (DL), and the gate of the first thin film transistor 10 is connected to the gate line (GL). The drain of the first thin film transistor 10 is connected to the capacitor line (CL) through the capacitor 80. A node is formed between the drain of the first thin film transistor 10 and the capacitor 80, and the gate of the second thin film transistor 20 is connected to the node. The common power line (VDD) is connected to the source of the second thin film transistor 20, and the anode of the organic light emitting diode 70 is connected to the drain.

In the present example embodiment, the first thin film transistor 10 is used as a switch for selecting a pixel (PE) to emit light. The first thin film transistor 10 is turned on and the capacitor 80 is charged, and, in this instance, the magnitude of the charge that is charged is in proportion to a potential of a voltage applied from the data line (DL). When a signal for increasing a voltage for each frame is input to the capacitor line (CL) while the first thin film transistor 10 is turned off, a gate potential of the second thin film transistor 20 rises according to the voltage that is applied through the capacitor line (CL) with reference to the potential charged in the capacitor 80. The second thin film transistor 20 is turned on when the gate potential exceeds a threshold voltage. The voltage applied to the common power line VDD is applied to the organic light emitting diode 70 through the second thin film transistor 20, and the organic light emitting diode 70 emits light.

An interlayer configuration of an organic light emitting diode display shown in FIG. 2 and FIG. 3 will now be described in detail with reference to FIG. 4.

Figure 4:
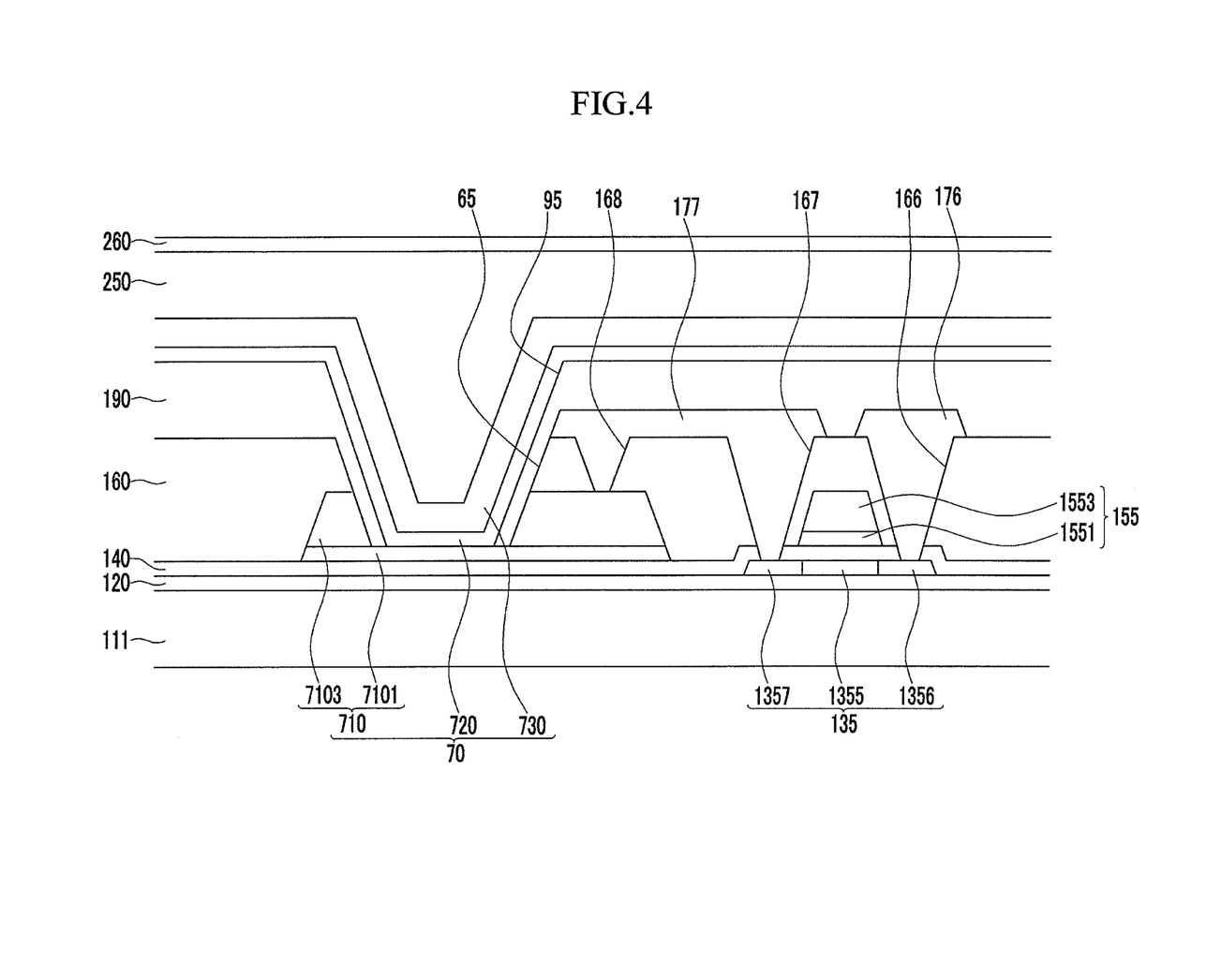
FIG. 4 shows a cross-sectional view of an organic light emitting diode (OLED) display according to an exemplary embodiment.

FIG. 4 shows a cross-sectional view of an organic light emitting diode (OLED) display according to an exemplary embodiment.

The second thin film transistor 20 and the pixel electrode 710 of the organic light emitting diode display shown in FIG. 2 will now be described according to a stacked order. The second thin film transistor 20 will be called a thin film transistor.

In an implementation, the substrate 111 may be an insulating substrate made of, e.g., glass, quartz, or ceramic. In an implementation, the substrate 111 may be a flexible substrate made of a polymer material such as a polyimide, polyethersulfone, or polyethylene naphthalate.

In the present example embodiment, a buffer layer 120 is formed on the substrate 111. The buffer layer 120 may be formed with a single film of silicon nitride (SiNx) or double films (not shown) of stacked silicon nitride (SiNx) and silicon oxide ($SiO_2$). The buffer layer 120 may prevent permeation of unnecessary components such as impurities or moisture, and simultaneously flattens the surface.

In the present example embodiment, a semiconductor 135 made of polysilicon is formed on the buffer layer 120. The semiconductor 135 includes a channel region 1355, and a source region 1356 and a drain region 1357 formed on both sides of the channel region 1355. The channel region 1355 of the semiconductor 135 is polysilicon to which an impurity is not doped, that is, an intrinsic semiconductor. The source region 1356 and the drain region 1357 of the semiconductor 135 are polysilicon to which a conductive impurity is doped, that is, impurity semiconductor. The impurity doped to the source region 1356 and the drain region 1357 may be one of a p-type impurity and an n-type impurity.

In the present example embodiment, a gate insulating layer 140 is formed on the semiconductor 135. The gate insulating layer 140 may be a single layer or multiple layers including at least one of tetraethyl orthosilicate (TEOS), silicon nitride, and silicon oxide.

In the present example embodiment, a gate electrode 155 and a pixel electrode 710 are formed on the gate insulating layer 140. The gate electrode 155 is overlapped on the channel region 1355, and the pixel electrode 710 may be the first electrode of FIG. 1. The gate electrode 155 includes a first lower metal layer 1551 and a first upper metal layer 1553, and the pixel electrode 710 includes a second lower metal layer 7101 and a second upper metal layer 7103. The first lower metal layer 1551 and the second lower metal layer 7101 may be formed with indium tin oxide (ITO), indium zinc oxide (IZO), zinc oxide (ZnO), or indium oxide ($In_2O_3$), which are transparent conductive materials. The first upper metal layer 1553 and the second upper metal layer 7103 may be formed with molybdenum, a molybdenum alloy, tungsten, or a tungsten alloy.

In the present example embodiment, an interlayer insulating layer 160 is formed on the gate electrode 155 and the pixel electrode 710. The interlayer insulating layer 160 may be formed with tetraethyl orthosilicate (TEOS), silicon nitride, or silicon oxide in a like manner of the gate insulating layer 140. The interlayer insulating layer 160 and the gate insulating layer 140 have a source contact hole 166 and a drain contact hole 167 for revealing the source region 1356 and the drain region 1357, respectively. The interlayer insulating layer 160 and the second upper metal layer 7103 have an opening 65 for exposing the second lower metal layer 7101.

In the present example embodiment, a source 176 and a drain 177 are formed on the interlayer insulating layer 160. The source 176 is connected to the source region 1356 through the source contact hole 166. The drain 177 is electrically connected to the drain region 1357 and the second upper metal layer 7103 through the drain contact hole 167 and a pixel contact hole 168. The pixel electrode 710 is connected to the drain 177 and becomes the anode of the organic light emitting diode. The pixel electrode 710 may be connected to the source (not shown)

In the present example embodiment, a pixel defining film 190 is formed on the interlayer insulating layer 160. The pixel defining film 190 includes an opening 95 for exposing the second lower metal layer 7101 through the opening 65. The pixel defining film 190 may be formed inclusive of a resin such as a polyacrylate or a polyimide and a silica-based inorganic material.

In the present example embodiment, an organic emission layer 720 is formed in the opening 95 of the pixel defining film 190. The organic emission layer 720 is formed with multiple layers including at least one of an emission layer, a hole injection layer (HIL), a hole transport layer (HTL), an electron transport layer (ETL), and an electron injection layer (EIL). When the organic emission layer 720 includes all of the aforementioned layers, the hole injection layer (HIL) is provided on the pixel electrode 710, which is the anode, on which the hole transport layer (HTL), the emission layer, the electron transport layer (ETL), and the electron injection layer (EIL) are sequentially stacked.

In the present example embodiment, a common electrode 730 is formed on the pixel defining film 190 and the organic emission layer 720. The common electrode 730 may be the second electrode of FIG. 1, and it becomes the cathode of the organic light emitting diode. Therefore, the pixel electrode 710, the organic emission layer 720, and the common electrode 730 configure the organic light emitting diode 70. The common electrode 730 may be a reflective layer or a semi-transmissive layer made of at least one of magnesium (Mg), silver (Ag), gold (Au), calcium (Ca), lithium (Li), chromium (Cr), aluminum (Al), or an alloy thereof. Also, the common electrode 730 may be a transparent layer in a like manner of the second lower metal layer 7101 of the pixel electrode 710.

In the present example embodiment, a packed layer 250 is formed on the common electrode 730. The packed layer 250 for providing a flat surface is formed by coating an organic material.

In the present example embodiment, a protective layer 260 is formed on the packed layer 250. The protective layer 260 is made of a graphene compound, and includes at least one of a graphene oxide and a graphene nitride. The graphene oxide and the graphene nitride include graphene, the surface of which is combined with oxygen or nitrogen, and they have an insulating property. When the protective layer is formed with the graphene compound, an expensive glass substrate may be omitted to thereby reduce the production cost of the organic light emitting diode display.

The graphene compound may have a very high hydrophobic characteristic. Without being bound by theory, the absorption energy with $H_2O$ and the graphene compound may be very much less than the internal combination energy of molecules of water drops. Therefore, the organic light emitting element may be protected from external moisture to prevent corrosion and oxidation. Further, the graphene compound may provide excellent strength and elasticity so it may be used to form the flexible organic light emitting diode display. Also, a bonding force with an inorganic material or an organic material forming the packed layer may be excellent to improve durability of the organic light emitting diode display.

Figure 5:
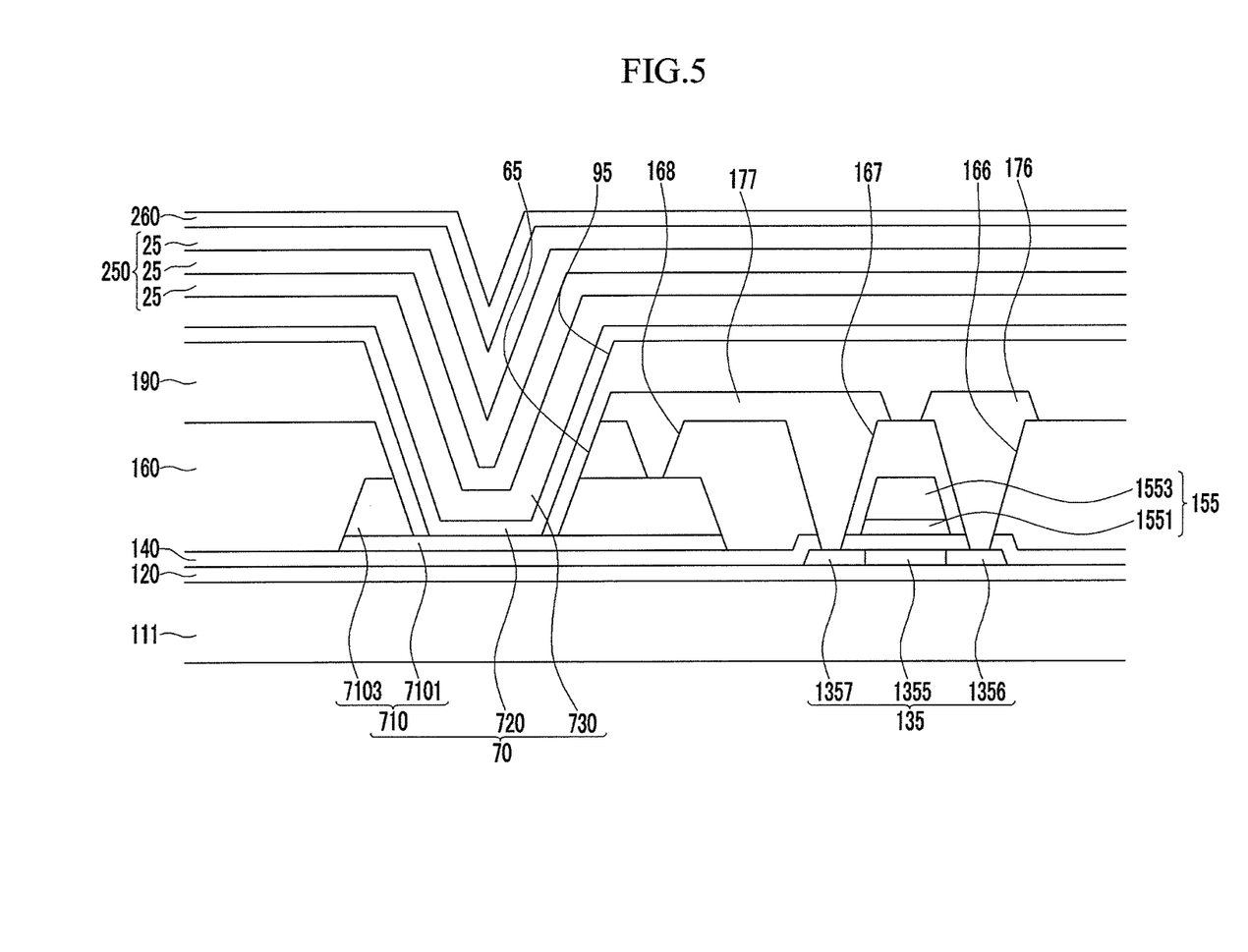
FIG. 5 shows a cross-sectional view of an organic light emitting diode (OLED) display according to another exemplary embodiment.

FIG. 5 shows a cross-sectional view of an organic light emitting diode (OLED) display according to another exemplary embodiment.

Most of the interlayer configuration is equivalent to that described with reference to FIG. 4, so no repeated description will be provided.

In the exemplary embodiment shown in FIG. 5, the organic light emitting diode display includes a substrate 111, a buffer layer 120 formed on the substrate 111, a semiconductor 135 formed on the buffer layer 120, a gate insulating layer 140 formed on the semiconductor 135, a gate electrode 155 and a pixel electrode 710 formed on the gate insulating layer 140, an interlayer insulating layer 160 formed on the pixel electrode 710 and the gate insulating layer 140, a source 176 and a drain 177 formed on the interlayer insulating layer 160, a pixel defining film 190 formed on the source 176 and the drain 177 and having an opening 95, an organic emission layer 720 formed on the opening 95, a common electrode 730 formed on the organic emission layer 720, and a packed layer 250 and a protective layer 260 stacked on the common electrode 730 and the pixel defining film 190.

The packed layer 250 of FIG. 5 includes a plurality of small packed layers 25. Each small packed layer 25 may be formed with an organic material or an inorganic material. FIG. 5 shows three layers, but more than the three layers may be stacked.

As shown in FIG. 5, the packed layer 250 including a plurality of small packed layers 25 is formed inclusive of an inorganic material. Thus, the mechanical characteristic may be improved compared to the case of forming the packed layer with a single layer as shown in FIG. 4, and inner diffusion of moisture and oxygen may be more efficiently prevented.

Figure 6:
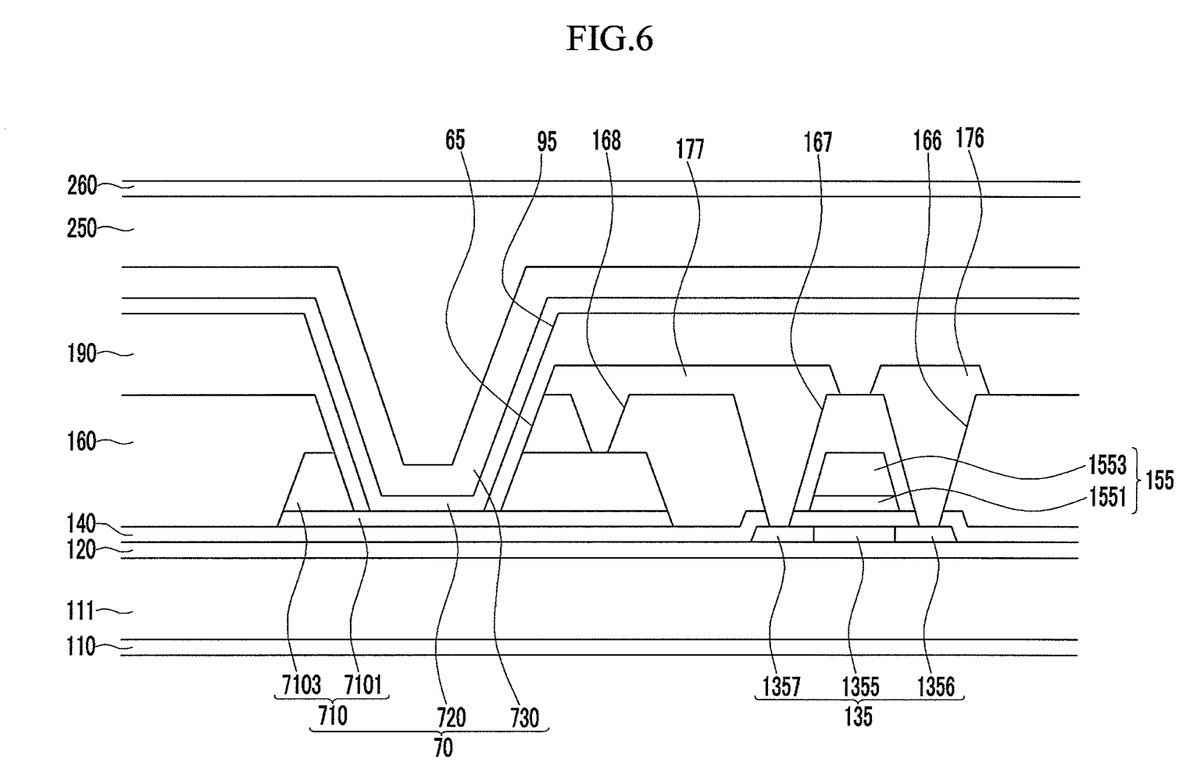
FIG. 6 and FIG. 7 show cross-sectional views of an organic light emitting diode (OLED) display according to another exemplary embodiment.
Figure 7:
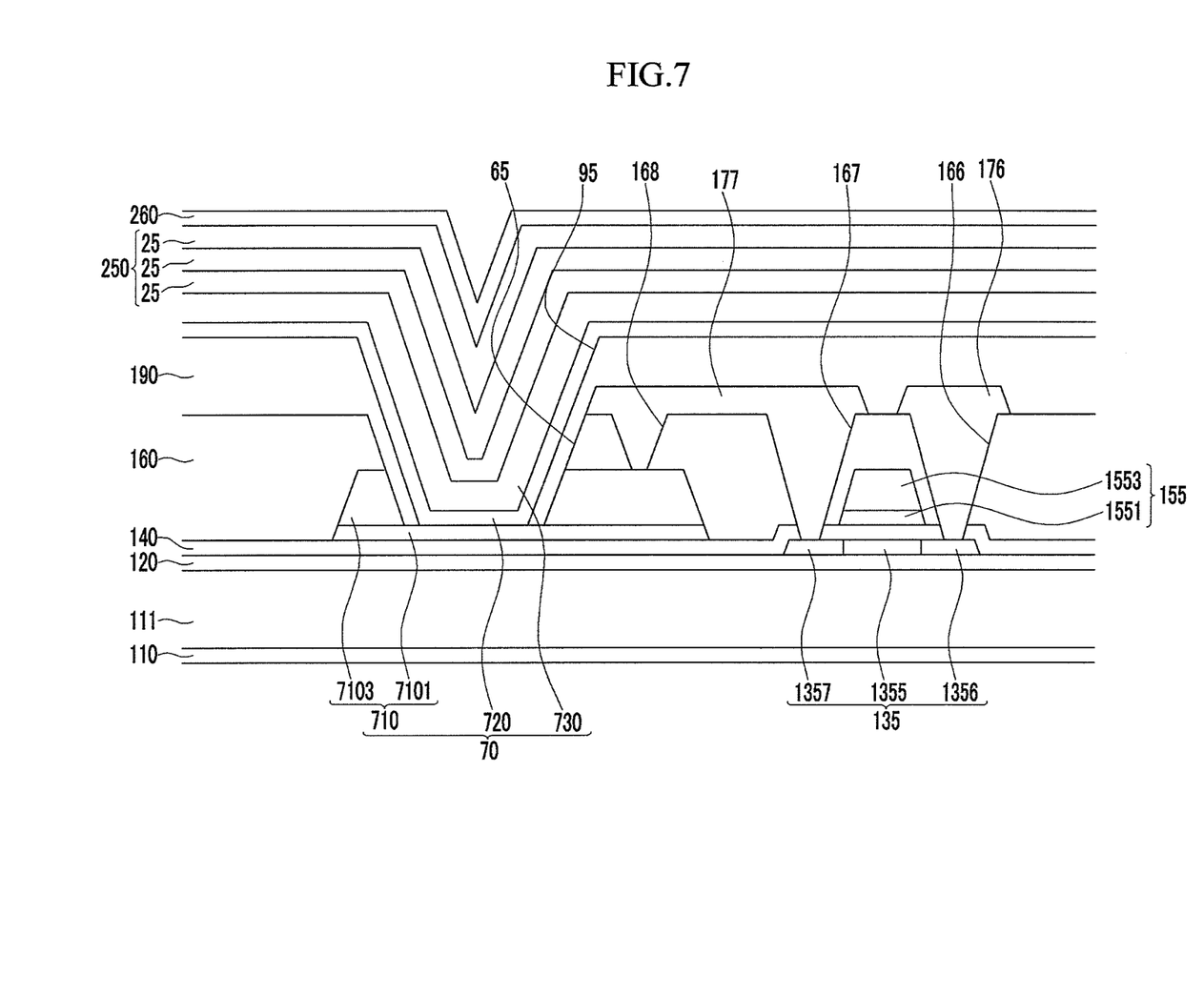

FIG. 6 and FIG. 7 show cross-sectional views of an organic light emitting diode (OLED) display according to another exemplary embodiment.

Most of the interlayer configuration is equivalent to that described with reference to FIG. 4 and FIG. 5, so no repeated description will be provided.

In the exemplary embodiment shown in FIG. 6 and FIG. 7, the organic light emitting diode display includes a substrate 111, a buffer layer 120 formed on the substrate 111, a semiconductor 135 formed on the buffer layer 120, a gate insulating layer 140 formed on the semiconductor 135, a gate electrode 155 and a pixel electrode 710 formed on the gate insulating layer 140, an interlayer insulating layer 160 formed on the pixel electrode 710 and the gate insulating layer 140, a source 176 and a drain 177 formed on the interlayer insulating layer 160, a pixel defining film 190 formed on the source 176 and the drain 177 and having an opening 95, an organic emission layer 720 formed in the opening 95, a common electrode 730 formed on the organic emission layer 720, and a packed layer 250 and a protective layer 260 stacked on the common electrode 730 and the pixel defining film 190.

The substrate 111 of FIG. 6 and FIG. 7 may be a flexible substrate made of a polymer material such as a polyimide, polyethersulfone, or polyethylene naphthalate.

The substrate 111 of FIG. 6 and FIG. 7 further includes a lower substrate 110 formed on an opposite side where the organic light emitting diode is not provided.

The lower substrate 110 may be formed with the same material as the protective layer 260, and may efficiently prevent permeation of external oxygen and moisture.

Also, the mechanical characteristic of the flexible substrate 111 may be improved.

By way of summation and review, in an organic light emitting diode display, an organic emission layer may be formed between a first electrode and a second electrode that are formed on a substrate, and an electrode and the organic emission layer may be protected by a protective layer. The substrate of the organic light emitting diode display may be made of glass or a flexible polymer film to prevent oxidation and corrosion caused by permeation of external moisture or oxygen. Also, a substrate may be attached to an opposite side so as to prevent permeation of moisture or oxygen.

A glass substrate may be expensive, and may be is weak and easily broken when an external impact is applied thereto. The protective layer may be formed by using an organic film such as a polyimide and an inorganic film such as silicon oxide film instead of the glass substrate, but films may have limitations in their application because panel reliability may be deteriorated because of permeation of moisture and oxygen.

According to an embodiment, when the protective layer is formed by using the graphene compound, oxygen and moisture may be effectively blocked with a low cost. Embodiments may provide an organic light emitting diode (OLED) display for replacing an organic substrate that is heavy, expensive, and weak with regard to an external impact, and providing a protective layer with an excellent characteristic of preventing permeation of moisture and oxygen to thus improve reliability.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode display, comprising:
    a substrate;
    an organic light emitting diode provided on the substrate and including a first electrode, an organic emission layer, and a second electrode;
    a packed layer on the organic light emitting diode; and
    a protective layer on the packed layer, the protective layer including at least one of a graphene oxide and a graphene nitride.

2. The organic light emitting diode display as claimed in claim 1, wherein the packed layer includes at least one selected from the group of an organic material and an inorganic material.

3. The organic light emitting diode display as claimed in claim 2, wherein the packed layer includes the organic material, and the organic material includes a polyimide.

4. The organic light emitting diode display as claimed in claim 2, wherein the packed layer includes the inorganic material, and the organic material includes at least one selected from the group of silicon oxide and silicon nitride.

5. The organic light emitting diode display as claimed in claim 2, wherein the packed layer is a stack of multiple layers.

6. The organic light emitting diode display as claimed in claim 1, wherein the substrate is made of glass or a flexible polymer.

7. The organic light emitting diode display as claimed in claim 1, wherein the substrate includes an upper substrate and a lower substrate, the upper substrate being made of a flexible polymer, and the lower substrate being made of a graphene compound.

8. The organic light emitting diode display as claimed in claim 7, wherein:
    the flexible polymer includes at least one selected from the group of a polyimide, polyethersulfone, and polyethylene naphthalate, and
    the graphene compound includes at least one selected from the group of a graphene oxide and a graphene nitride.

9. The organic light emitting diode display as claimed in claim 1, wherein the display includes, in sequence:
    the substrate,
    the organic light emitting diode,
    the packed layer, the packed layer planarizing the underlying the organic light emitting diode, and
    the protective layer, the protective layer having a substantially uniform thickness.

10. The organic light emitting diode display as claimed in claim 9, wherein the substrate includes, in sequence:

a lower substrate, and an upper substrate, the upper substrate contacting the lower substrate, the upper substrate being between the lower substrate and the organic light emitting diode.

11. The organic light emitting diode display as claimed in claim 10, wherein the packed layer includes a stack of multiple layers between the organic light emitting diode and the protective layer, the multiple layers including alternating organic and inorganic layers respectively formed from polyimide and at least one selected from the group of silicon oxide and silicon nitride.

* * * * *